US009196865B2

(12) United States Patent
Kwak et al.

(10) Patent No.: US 9,196,865 B2
(45) Date of Patent: Nov. 24, 2015

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Won-Kyu Kwak, Yongin (KR); Han-Sung Bae, Yongin (KR); Sun-Youl Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/284,355

(22) Filed: May 21, 2014

(65) Prior Publication Data
US 2015/0194628 A1    Jul. 9, 2015

(30) Foreign Application Priority Data

Jan. 6, 2014  (KR) .......................... 10-2014-0001495

(51) Int. Cl.
| H01L 51/50 | (2006.01) |
| H01L 51/52 | (2006.01) |
| H01L 27/32 | (2006.01) |

(52) U.S. Cl.
CPC ........ *H01L 51/5253* (2013.01); *H01L 27/3246* (2013.01); *H01L 27/3251* (2013.01); *H01L 27/3276* (2013.01); *H01L 51/5246* (2013.01)

(58) Field of Classification Search
None
See application file for complete search history.

(56) References Cited

U.S. PATENT DOCUMENTS

| 4,774,435 | A | 9/1988 | Levinson |
| 8,614,699 | B2 | 12/2013 | Miyake et al. |
| 2004/0227462 | A1 | 11/2004 | Utsumi et al. |
| 2006/0060850 | A1 | 3/2006 | Kwak et al. |
| 2007/0046193 | A1* | 3/2007 | Rhee et al. .................... 313/506 |
| 2007/0080377 | A1* | 4/2007 | Sung et al. .................... 257/253 |
| 2009/0322657 | A1 | 12/2009 | Na et al. |
| 2010/0025664 | A1* | 2/2010 | Park ............................... 257/40 |

FOREIGN PATENT DOCUMENTS

| JP | 2006-058751 A | 3/2006 |
| KR | 1999-0060923 A | 7/1999 |
| KR | 10-2005-0113517 A | 12/2005 |
| KR | 10-2009-0061387 A | 6/2009 |
| KR | 10-2010-0001597 A | 1/2010 |

* cited by examiner

*Primary Examiner* — Khaja Ahmad
(74) *Attorney, Agent, or Firm* — Christie, Parker & Hale, LLP

(57) ABSTRACT

An organic light-emitting display apparatus includes: a first substrate; an insulating layer on the first substrate; a signal wiring on the insulating layer; an organic light-emitting device on the first substrate, the organic light-emitting device defining an active area and including a first electrode, a second electrode, and an intermediate layer between the first and second electrodes; a passivation layer on the insulating layer; and a metal layer on the passivation layer at an outer region adjacent to the active area, separated from the first electrode, and contacting the second electrode and the signal wiring, wherein a first opening is in the passivation layer at the outer region, and the metal layer contacts the insulating layer at the first opening.

12 Claims, 3 Drawing Sheets

ORGANIC LIGHT-EMITTING DISPLAY APPARATUS

CROSS-REFERENCE TO RELATED APPLICATION

This application claims priority to and the benefit of Korean Patent Application No. 10-2014-0001495, filed on Jan. 6, 2014 in the Korean Intellectual Property Office, the disclosure of which is incorporated herein in its entirety by reference.

BACKGROUND

1. Field

One or more embodiments of the present invention relate to an organic light-emitting display apparatus.

2. Description of the Related Art

An organic light-emitting display apparatus using an organic light-emitting device has a faster response time than a liquid crystal display (LCD) that is currently widely used and thus, is capable of better displaying or realizing a moving image. Also, because the organic light-emitting display apparatus is self-emitting, has a wide viewing angle, and has high luminance, the organic light-emitting display apparatus is receiving attention as a next generation display apparatus.

The organic light-emitting device includes a pixel electrode and a counter electrode, which face each other, and an emission layer including an organic material disposed between the pixel electrode and the counter electrode. The organic material is very sensitive to moisture, oxygen, and light, and thus, when it comes into contact with any of them, a pixel shrinkage phenomenon wherein an emission region is gradually reduced in size may occur or a dark spot may be generated in the emission region. Thus, a lifespan and/or quality of the organic light-emitting device may be affected.

SUMMARY

One or more embodiments of the present invention relate to an organic light-emitting display apparatus.

Additional aspects will be set forth in part in the description which follows and, in part, will be apparent from the description or may be learned by practice of the presented embodiments.

According to an embodiment of the present invention, an organic light-emitting display apparatus includes: a first substrate; an insulating layer on the first substrate; a signal wiring on the insulating layer; an organic light-emitting device (OLED) on the first substrate, the OLED defining an active area and including a first electrode, a second electrode, and an intermediate layer between the first and second electrodes; a passivation layer on the insulating layer; and a metal layer on the passivation layer at an outer region adjacent to the active area, separated from the first electrode, and contacting the second electrode and the signal wiring, wherein a first opening is in the passivation layer at the outer region, and the metal layer contacts the insulating layer at the first opening.

The first opening may extend across the passivation layer, and the passivation layer may include two portions separated at the first opening.

The metal layer may have a second opening outside the second electrode.

The metal layer may have a plurality of the second openings.

The plurality of the second openings may be arranged along a line parallel to an end of the second electrode.

The plurality of the second openings may be arranged at an interval.

The second openings may be configured to allow impurities in the passivation layer to pass therethrough.

The metal layer may include a same material as that of the first electrode.

The organic light-emitting display apparatus may further include a pixel-defining film covering a part of the first electrode and a part of the metal layer and contacting the passivation layer, wherein the first opening may be outside the pixel-defining film.

The second electrode may be electrically coupled to the signal wiring through the metal layer.

A circuit unit may be below the passivation layer.

The first opening may prevent impurities in the passivation layer outside the active area from migrating to the active area.

The organic light-emitting display apparatus may further include: a second substrate on the second electrode; and a sealant between the first and second substrates and coupling the first and second substrates.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
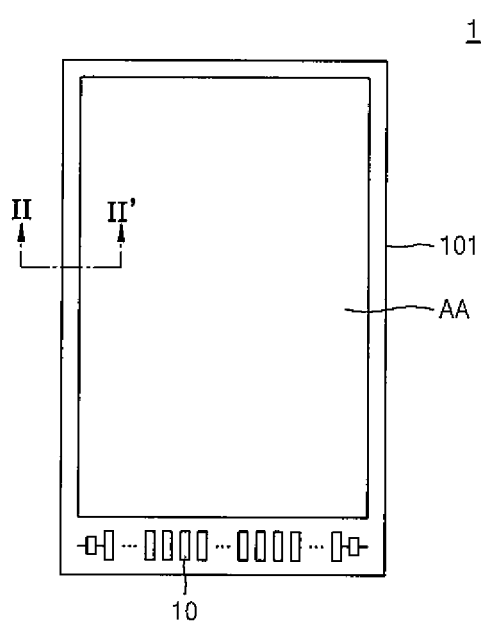
FIG. 1 is a plan view schematically illustrating a part of an organic light-emitting display apparatus according to an embodiment of the present invention.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

In the drawings, like reference numerals refer to like elements throughout and overlapping descriptions may not be repeated.

While terms, such as "first", "second", etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including," "comprising," or "having," etc., are intended to indicate the existence of the features or components and are not intended to preclude the possibility that one or more other features or components may also exist or may be added.

It will be understood that when a component or layer is referred to as being "on" another component or layer, the component or layer can be directly on the other component or layer or intervening component or layers may also be present.

In the drawings, for convenience of description, sizes and/or or thicknesses of components or layers may be exaggerated for clarity. For example, because sizes and/or thicknesses of components or layers in drawings are arbitrarily shown for convenience of description, the sizes and thicknesses are not limited thereto.

Expressions such as "at least one of," when preceding a list of elements, modify the entire list of elements and do not modify the individual elements of the list. Further, the use of "may" when describing embodiments of the present invention relates to "one or more embodiments of the present invention."

Hereinafter, one or more embodiments of the present invention will be described in detail with reference to accompanying drawings.

Figure 2:
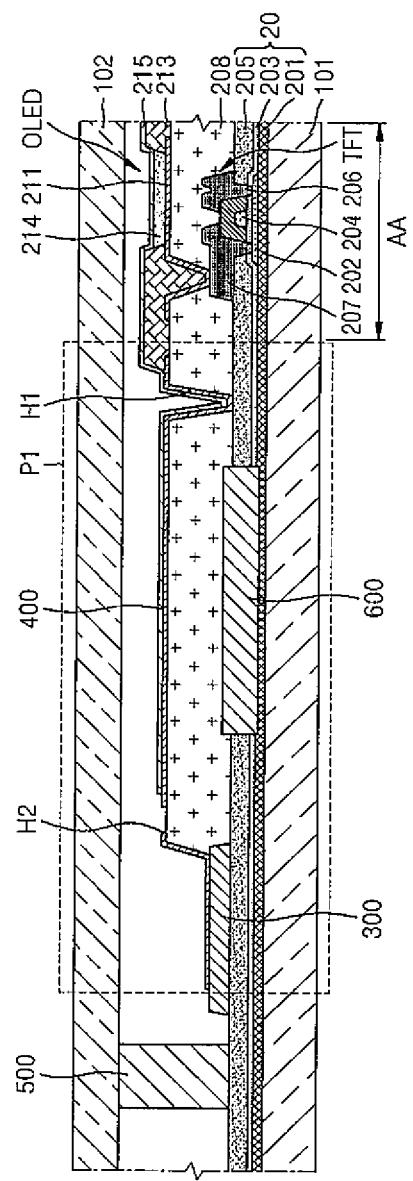
FIG. 2 is a cross-sectional view taken along the line II-II' of FIG. 1.
Figure 3:
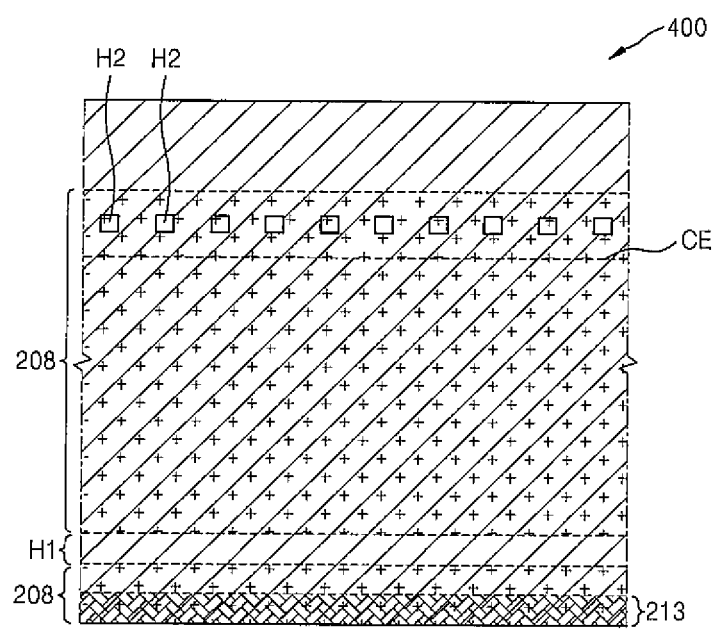
FIG. 3 is a plan view of the region P1 of FIG. 2.

FIG. 1 is a plan view schematically illustrating a part of an organic light-emitting display apparatus 1 according to an embodiment of the present invention, FIG. 2 is a cross-sectional view taken along the line II-II' of FIG. 1, and FIG. 3 is a plan view of the region P1 of FIG. 2.

Referring to FIGS. 1 and 2, the organic light-emitting display apparatus 1 according to an embodiment of the present invention includes a first substrate 101, an insulating layer 20 formed on the first substrate 101, a signal wiring 300 formed on the insulating layer 20, an organic light-emitting device OLED for defining an active area AA on the first substrate 101, a passivation layer 208 formed on the insulating layer 20, and a metal layer 400 formed on the passivation layer 208 at an outer region outside of (e.g., adjacent to) the active area AA.

The first substrate 101 may be a flexible substrate and may be formed of plastic having excellent thermal resistance and excellent durability. However, the first substrate 101 is not limited thereto and may be formed of any one of various materials, such as metal or glass.

The organic light-emitting device OLED defines the active area AA of the first substrate 101 and is electrically coupled (e.g., electrically connected) to a thin-film transistor TFT. A pad unit 10 may be disposed around the active area AA so as to transmit an electric signal from a power supply device or a signal generating apparatus to the active area AA.

An internal structure of the organic light-emitting display apparatus 1 will now be described in further detail with reference to FIG. 2.

The insulating layer 20 may be formed on the first substrate 101. The insulating layer 20 may include a buffer layer 201, a gate insulating film 203, and an interlayer insulating film 205.

The buffer layer 201 may be formed directly on the first substrate 101. The buffer layer 201 may be formed on an entire surface of the first substrate 101 (e.g., at the active area AA and at the outer region). The buffer layer 201 may be formed of any material capable of preventing impure elements from penetrating through the first substrate 101 and providing a flat surface on the first substrate 101.

The thin-film transistor TFT may be formed on the buffer layer 201. The thin-film transistor TFT may include an active layer 202, a gate electrode 204, a source electrode 206, and a drain electrode 207.

The active layer 202 may be formed of an inorganic semiconductor, such as amorphous silicon or polysilicon, an organic semiconductor, or an oxide semiconductor and may include a source region, a drain region, and a channel region.

The gate insulating film 203 is formed on the active layer 202. The gate insulating film 203 may be formed to correspond to (e.g., may be formed on) the entire first substrate 101. For example, the gate insulating film 203 may be formed to correspond to the active area AA and the outer region of the first substrate 101. The gate insulating film 203 is used to insulate the active layer 202 and the gate electrode 204 from each other and may be formed of an organic material or an inorganic material, such as $SiN_x$ or $SiO_2$.

The gate electrode 204 is formed on the gate insulating film 203. The gate electrode 204 may include gold (Au), silver (Ag), copper (Cu), nickel (Ni), platinum (Pt), palladium (Pd), aluminum (Al), or molybdenum (Mo), or may include an alloy, such as aluminum:neodymium (Al:Nd) or molybdenum:tungsten (Mo:W), but is not limited thereto and may be formed of any suitable material considering design conditions.

The interlayer insulating film 205 is formed on the gate electrode 204. The interlayer insulating film 205 may be formed to correspond to an entire surface of the first substrate 101. For example, the interlayer insulating film 205 may be formed to correspond to the active area AA and the outer region.

The interlayer insulating film 205 is disposed between the gate electrode 204 and the source electrode 206 and between the gate electrode 204 and the drain electrode 207 to insulate them and may be formed of an inorganic material, such as $SiN_x$ or $SiO_2$.

The signal wiring 300 may be formed on the insulating layer 20. The signal wiring 300 may be formed on the interlayer insulating film 205. The signal wiring 300 may be formed at the outer region. The signal wiring 300 may be electrically coupled to a second electrode 215 to supply a signal to the second electrode 215. The signal wiring 300 may be a cathode power supply line ELVSS. When the signal wiring 300 is the cathode power supply line ELVSS, the cathode power supply line ELVSS may be coupled to (e.g., connected to) a cathode power source having (e.g., supplying) a lower voltage than a common power supply voltage; for example, the cathode power supply line ELVSS may be a ground voltage or a negative (−) voltage. The signal wiring 300 may be formed of the same material as the source or drain electrode 206 or 207 and may be formed during the same act or process.

The source and drain electrodes 206 and 207 are formed on the interlayer insulating film 205. For example, the interlayer insulating film 205 and the gate insulating film 203 are formed to expose the source and drain regions of the active layer 202, and the source and drain electrodes 206 and 207 are formed to contact the exposed source and drain regions of the active layer 202.

The thin-film transistor TFT of FIG. 2 is a top-gate transistor sequentially including the active layer 202, the gate electrode 204, and the source and drain electrodes 206 and 207, but alternatively, the gate electrode 204 may be disposed below the active layer 202.

The thin-film transistor TFT is electrically coupled to the organic light-emitting device OLED to drive the organic light-emitting device OLED and is covered and protected by the passivation layer 208.

The passivation layer 208 may be an organic insulating film. Impurities may be generated in and/or may be present in the passivation layer 208. The impurities may be, for example, remaining moisture generated during operations (e.g., during manufacture).

The passivation layer 208 may be formed on the insulating layer 20. The passivation layer 208 may be formed on the interlayer insulating film 205. The passivation layer 208 may cover a part of the signal wiring 300.

A first opening H1 (e.g., a first hole) may be formed in the passivation layer 208. The first opening H1 may be formed at the outer region. The first opening H1 may have a valley shape. By forming the first opening H1, impurities generated in and/or present in the passivation layer 208 formed outside the first opening H1 or generated in and/or present in the passivation layer 208 formed at the outer region (e.g., a portion of the passivation layer 208 at a side of the first opening H1 opposite to the active area AA) may be prevented from being transmitted to (e.g., from migrating to) the active area AA. Accordingly, a pixel shrinkage phenomenon may be prevented, thereby increasing a lifespan and reliability of the organic light-emitting display apparatus 1.

The metal layer 400 may be formed on the passivation layer 208. The metal layer 400 may contact the second electrode 215. The metal layer 400 may contact the signal wiring 300. When the metal layer 400 contacts the signal wiring 300, the second electrode 215 and the signal wiring 300 may be electrically coupled to each other. The metal layer 400 may be formed of the same material as a first electrode 211 and during the same act or process.

The metal layer 400 may contact the insulating layer 20 through the first opening H1. The metal layer 400 may contact the interlayer insulating film 205 through the first opening H1. Accordingly, the passivation layer 208 may be separated (e.g., separated into two portions) by the first opening H1 (e.g., the first opening H1 may extend across the entire passivation layer 208).

A second opening H2 (e.g., a second hole) may be formed in the metal layer 400. The second opening H2 may be formed outside the second electrode 215. A plurality of second openings 1-12 may be formed. The impurities generated in the passivation layer 208 below the metal layer 400 are discharged through (e.g., emitted through) the second opening H2 and thus, are prevented from being transmitted into (e.g., migrating to) the active area AA. Accordingly, a pixel shrinkage phenomenon is reduced or prevented, thereby increasing the lifespan and reliability of the organic light-emitting display apparatus 1.

The organic light-emitting device OLED is formed on the passivation layer 208, and the organic light-emitting device OLED may include the first electrode 211, an intermediate layer 214, and the second electrode 215.

The first electrode 211 is formed on the passivation layer 208. For example, the passivation layer 208 does not cover the entire drain electrode 207 but exposes a region (e.g., a predetermined region) of the drain electrode 207, and the first electrode 211 may be formed to be coupled (e.g., connected) to the exposed region of the drain electrode 207.

In the current embodiment, the first electrode 211 may be a reflective electrode.

The second electrode 215, disposed to face the first electrode 211, may be a transparent or semi-transparent electrode.

Accordingly, the second electrode 215 may allow light emitted from an organic emission layer included in the intermediate layer 214 to penetrate therethrough. For example, the light emitted from the organic emission layer may be reflected at or by the first electrode 211 that is a reflective electrode and be transmitted towards the second electrode 215 or may be directly discharged or emitted towards the second electrode 215.

However, the organic light-emitting display apparatus 1 according to the current embodiment is not limited to a top emission apparatus but may be a bottom emission apparatus wherein the light emitted from the organic emission layer is discharged or emitted towards the first substrate 101. In this case, the first electrode 211 may be a transparent or semi-transparent electrode, and the second electrode 215 may be a reflective electrode. Alternatively, the organic light-emitting display apparatus 1 may be a dual emission apparatus wherein the light is discharged or emitted in two directions, towards both front and rear surfaces thereof.

A pixel-defining film 213 is formed of an insulating material and on the first electrode 211.

The pixel-defining film 213 may cover a part of the metal layer 400. The pixel-defining film 213 may cover a part of the first electrode 211. The first opening H1, formed in the passivation layer 208, may be formed outside the pixel-defining film 213. The pixel-defining film 213 may contact the passivation layer 208 therebelow. In this embodiment, the pixel-defining film 213 may contact the passivation layer 208 formed at a side of the first opening H1 closer to the active area AA. Accordingly, the impurities generated in and/or present in the passivation layer 208 formed outside the first opening H1 (e.g., at a portion of the passivation layer 208 at a side of the first opening H1 opposite to the active area AA) may be prevented from being transmitted to (e.g., migrating to) the active area AA through the pixel-defining film 213.

The second electrode 215 may be electrically coupled to the signal wiring 300 through the metal layer 400.

The pixel-defining film 213 exposes a region (e.g., a predetermined region) of the first electrode 211, and the intermediate layer 214 is disposed on the exposed region of the first electrode 211.

The intermediate layer 214 includes the organic emission layer. Alternatively, the intermediate layer 214 may include the organic emission layer and may further include at least one of a hole injection layer (HIL), a hole transport layer (HTL), an electron transport layer (ETL), and/or an electron injection layer (EIL). However, the current embodiment is not limited thereto, and the intermediate layer 214 may include the organic emission layer and may further include other various functional layers.

A built-in circuit unit 600 may be formed below the passivation layer 208. The built-in circuit unit 600 may be formed at the outer region. The built-in circuit unit 600 may be formed of a plurality of thin-film transistors TFT.

A second substrate 102 is disposed on or above the second electrode 215. The second substrate 102 may be a flexible substrate and may be formed of plastic having excellent thermal resistance and excellent durability. However, the second substrate 102 may be formed of any of various materials, such as metal or glass.

A sealant 500 is disposed between the first and second substrates 101 and 102 (e.g., the sealant 500 may extend between corresponding portions of the first and second substrates 101 and 102). The sealant 500 may be formed on the insulating layer 20. The sealant 500 couples (e.g., combines) the first and second substrates 101 and 102 to each other. The sealant 500 may be formed at the outer region. The sealant 500 may include frit. The sealant 500 operates as a shielding film (e.g., an important shielding film) for preventing an organic material of the organic light-emitting device OLED from being deformed due to impurities, such as external oxygen and moisture.

The first opening H1 and the second opening H2 will now be described in further detail with reference to FIG. 3.

Referring to FIG. 3, the metal layer 400 may be formed on the passivation layer 208. The second opening H2 may be formed in the metal layer 400. The second opening H2 may be formed outside an end line CE of the second electrode 215. In this embodiment, the plurality of second openings H2 may be formed (e.g., the plurality of second openings may be arranged parallel to the end line CE and may be arranged at an interval). When the second opening H2 is formed, the impurities generated in and/or present in the passivation layer 208 may be discharged through (e.g., emitted through) the second opening H2. Accordingly, the impurities may be prevented from being transmitted to the active area AA, thereby increasing the lifespan of the organic light-emitting display apparatus 1.

The first opening H1 may be formed in the passivation layer 208. The first opening H1 may have a valley shape. The passivation layer 208 may have a structure separated by the first opening H1 (e.g., the passivation layer 208 may be two portions thereof separated by the first opening H1), and the impurities generated in the passivation layer 208 outside the first opening H1 are prevented from penetrating into the organic light-emitting device OLED along or through the pixel-defining film 213 due to the separated structure, thereby increasing the lifespan of the organic light-emitting display apparatus 1. Also, because the metal layer 400 and the insulating layer 20 contact each other at the first opening H1, the passivation layer 208 may have a further sealed and/or separated structure.

As described above, according to one or more of the above embodiments of the present invention, a pixel shrinkage phenomenon may be prevented, thereby increasing a lifespan and reliability of an organic light-emitting display apparatus.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. An organic light-emitting display apparatus comprising:
   a first substrate;
   an insulating layer on the first substrate;
   a signal wiring on the insulating layer;
   an organic light-emitting device on the first substrate, the organic light-emitting device defining an active area and comprising a first electrode, a second electrode, and an intermediate layer between the first and second electrodes;
   a passivation layer on the insulating layer;
   a metal layer on the passivation layer at an outer region adjacent to the active area, separated from the first electrode, and contacting the second electrode and the signal wiring; and
   a pixel-defining film covering a part of the first electrode and a part of the metal layer and contacting the passivation layer,
   wherein a first opening is in the passivation layer at the outer region and past an outermost end of the pixel-defining film, and the metal layer contacts the insulating layer at the first opening.

2. The organic light-emitting display apparatus of claim 1, wherein the first opening extends across the passivation layer, and
   wherein the passivation layer comprises two portions separated at the first opening.

3. The organic light-emitting display apparatus of claim 1, wherein the metal layer has a second opening above the passivation layer and outside the second electrode.

4. The organic light-emitting display apparatus of claim 3, wherein the metal layer has a plurality of the second openings.

5. The organic light-emitting display apparatus of claim 4, wherein the plurality of the second openings are arranged along a line parallel to an end of the second electrode.

6. The organic light-emitting display apparatus of claim 5, wherein the plurality of the second openings are arranged at an interval.

7. The organic light-emitting display apparatus of claim 3, wherein the second opening is configured to allow impurities in the passivation layer to pass therethrough.

8. The organic light-emitting display apparatus of claim 1, wherein the metal layer comprises a same material as that of the first electrode.

9. The organic light-emitting display apparatus of claim 1, wherein the second electrode is electrically coupled to the signal wiring through the metal layer.

10. The organic light-emitting display apparatus of claim 1, wherein a circuit unit is below the passivation layer.

11. The organic light-emitting display apparatus of claim 1, wherein the first opening is configured to prevent impurities in the passivation layer at the outer region from migrating to the active area.

12. The organic light-emitting display apparatus of claim 1, further comprising:
    a second substrate over the second electrode; and
    a sealant between the first and second substrates and coupling the first and second substrates.

* * * * *